United States Patent
Sumiya et al.

(10) Patent No.: US 7,404,399 B2
(45) Date of Patent: Jul. 29, 2008

(54) DIAMOND TOOL, SYNTHETIC SINGLE CRYSTAL DIAMOND AND METHOD OF SYNTHESIZING SINGLE CRYSTAL DIAMOND, AND DIAMOND JEWELRY

(75) Inventors: Hitoshi Sumiya, Itami (JP); Yutaka Kobayashi, Itami (JP); Katsuyuki Kawate, Itami (JP); Takeru Nakashima, Itami (JP)

(73) Assignees: Sumitomo Electric Industries, Ltd., Osaka-shi (JP); Sumitomo Electric Hardmetal Corp., Itami-shi (JP)

( * ) Notice: Subject to any disclaimer, the term of this patent is extended or adjusted under 35 U.S.C. 154(b) by 136 days.

(21) Appl. No.: 10/572,708

(22) PCT Filed: Oct. 8, 2004

(86) PCT No.: PCT/JP2004/014910

§ 371 (c)(1), (2), (4) Date: Mar. 17, 2006

(87) PCT Pub. No.: WO2005/035174

PCT Pub. Date: Apr. 21, 2005

(65) Prior Publication Data

US 2007/0033810 A1 Feb. 15, 2007

(30) Foreign Application Priority Data

| Oct. 10, 2003 | (JP) | ............................. 2003-351497 |
| Sep. 28, 2004 | (JP) | ............................. 2004-282579 |
| Sep. 28, 2004 | (JP) | ............................. 2004-282692 |

(51) Int. Cl.
*B28D 5/04* (2006.01)

(52) U.S. Cl. .......................................... 125/39; 125/36
(58) Field of Classification Search .................. 125/39, 125/36; 175/420.2, 424; 407/118, 119, 120
See application file for complete search history.

(56) References Cited

U.S. PATENT DOCUMENTS

| 3,678,568 | A | * | 7/1972 | Knippenberg et al. ..... 228/124.5 |
| 5,133,332 | A | * | 7/1992 | Tanaka et al. ................. 125/39 |
| 5,340,012 | A | * | 8/1994 | Beeferman et al. ......... 228/56.3 |

(Continued)

FOREIGN PATENT DOCUMENTS

EP 0 647 590 4/1995

(Continued)

OTHER PUBLICATIONS

H. Sumiya, S. Satoh, "High-Pressure Synthesis of High-Purity Diamond Crystal", Diamond and Related Materials 5 Elsevier Science S.A., 1996 pp. 1359-1365.

*Primary Examiner*—Dung Van Nguyen
(74) *Attorney, Agent, or Firm*—W. F. Fasse; W. G. Fasse

(57) ABSTRACT

Various types of diamond tools are provided by utilizing the fact that a synthetic single crystal diamond for use in a tool having a nitrogen content of 3 ppm or less exhibits an enhanced hardness in a (100) plane in a <111> direction and simultaneously the reduction in defects. The above synthetic single crystal diamond is synthesized by the temperature difference method under an ultra high pressure at high temperature and contains, in its crystals, nickel introduced by atomic substitution or boron and nickel introduced by atomic substitution.

27 Claims, 5 Drawing Sheets

U.S. PATENT DOCUMENTS 5,785,039 A * 7/1998 Kobayashi et al. ............ 125/39
2003/0188550 A1 * 10/2003 Oki et al. ...................... 63/26

FOREIGN PATENT DOCUMENTS

| | | |
|---|---|---|
| EP | 0 894 766 | 2/1999 |
| JP | 05-137999 | 6/1993 |
| JP | 05-138000 | 6/1993 |
| JP | 05-200271 | 8/1993 |
| JP | 05-329356 | 12/1993 |
| JP | 06-182182 | 7/1994 |
| JP | 06-182184 | 7/1994 |
| JP | 07-116494 | 5/1995 |
| JP | 11-014524 | 1/1999 |
| JP | 11-100297 | 4/1999 |
| JP | 11-300194 | 11/1999 |
| JP | 2003-137686 | 5/2003 |
| RU | 2 270 743 | 2/2006 |

* cited by examiner

VIEW ALONG ARROW A

VIEW ALONG ARROW A

US 7,404,399 B2

DIAMOND TOOL, SYNTHETIC SINGLE CRYSTAL DIAMOND AND METHOD OF SYNTHESIZING SINGLE CRYSTAL DIAMOND, AND DIAMOND JEWELRY

TECHNICAL FIELD

The present invention relates generally to diamond tools, synthetic single crystal diamonds and methods of synthesizing single crystal diamonds, and diamond jewelry, and particularly to diamond tools exhibiting excellent performance, such as cutting tools and knives fabricated with diamond, and the like having a sharp cutting edge, excellent in resistance to abrasion and fracture and the like and stable in quality, diamond dies, dressers, styluses and the like excellent in abrasion resistance, synthetic single crystal diamonds having a crystal containing nickel by atomic substitution and methods of synthesizing such single crystal diamonds, synthetic single crystal diamonds having a crystal containing boron and nickel by atomic substitution and methods of synthesizing such single crystal diamonds, and diamond jewelry presenting bright color.

BACKGROUND ART

Conventional single crystal diamond tools have been fabricated with natural diamond selected from rough diamond, as appropriate. Furthermore, some conventional single crystal diamond tools have been fabricated with artificial, synthetic single crystal diamond (of the Ib type) containing nitrogen as an impurity.

Diamond is widely used in industrial applications, for jewelry and the like as it is significantly high in hardness and significantly satisfactory in thermal conductance and has a large index of refraction and thus shines bright. However, natural diamond is significantly expensive. Accordingly, industrially manufactured diamonds are widely used mainly in industrial applications. Such industrially manufactured diamonds are typically synthesized by a temperature difference method or the like growing a crystal under ultra high pressure at high temperature (as described in Patent Documents 1-6).

Furthermore, with the recent industrial sophistication, there has also been developed a synthetic single crystal diamond excellent, uniform and the like in abrasion resistance and thus superior in such mechanical and physical properties to natural diamond (as described in Patent Documents 7-9).

Furthermore, there has also been developed a synthetic single crystal diamond that is semiconducting or electrically conductive or similarly has a property that is inherently not possessed by diamond (as described in Patent Document 10).

Patent Document 1: Japanese Patent Laying-Open No. 60-12747
Patent Document 2: Japanese Patent Laying-Open No. 5-137999
Patent Document 3: Japanese Patent Laying-Open No. 5-138000
Patent Document 4: Japanese Patent Laying-Open No. 5-329356
Patent Document 5: Japanese Patent Laying-Open No. 6-182182
Patent Document 6: Japanese Patent Laying-Open No. 6-182184
Patent Document 7: Japanese Patent Laying-Open No. 3-131407
Patent Document 8: Japanese Patent Laying-Open No. 3-228504
Patent Document 9: Japanese Patent Laying-Open No. 7-116494
Patent Document 10: Japanese Patent Laying-Open No. 5-200271
Non-Patent Document 1: Sumiya et al., Diamond and Related Materials, 5, 1359 (1996).

DISCLOSURE OF THE INVENTION

Problems to be Solved by the Invention

As natural diamond contains a large amount of nitrogen as impurity and also reflects its intraterrestrial, complex growth history, its crystals have a large number of strains and crystal defects and also have significant variation therebetween. It is substantially impossible to constantly obtain from natural diamond a crystal of high quality free of impurities, crystal defects and the like. Natural diamond's such crystal defects, impurities and the like serve as a point allowing destruction to start therefrom. As such, conventional tools fabricated with natural diamond are unreliable in quality and significantly vary in performance, life and the like.

In contrast, a single crystal of synthetic diamond grown under high pressure at high temperature allowing diamond to be thermodynamically stable is further more excellent in crystallinity and also stable in quality than natural diamond. Typical synthetic diamond, however, contains several tens to several hundreds ppm of nitrogen as an isolated substitutional impurity (i.e., the Ib type), affecting a variety of characteristics. In particular, for ultraviolet and infrared ranges, the impurity of nitrogen causes significant absorption. Furthermore, the impurity of nitrogen is not distributed in the crystal uniformly. As such, the crystal internally has more or less strain.

Furthermore, of artificial synthetic diamonds, that of the Ib type containing an impurity of nitrogen as an isolated substitutional impurity is used to fabricate cutting tools, knives and the like. While artificial, synthetic diamond is further more excellent in stability in quality than natural diamond, it has been insufficient in sharpness and abrasion resistance, which determine the tool's characteristics.

When the temperature difference method is employed to synthesize a diamond without employing a solvent of metal having a special nitrogen getter added thereto, the nitrogen contained in the solvent would be taken into a crystal, resulting in a yellowed diamond, as is also described in Patent Documents 2-6.

This nitrogen is a substitutional atomic impurity and in addition a nitrogen atom is larger in size than a carbon atom. This causes the diamond's cubic crystal structure to be partially distorted. Consequently the diamond is reduced in hardness and thermal conductance.

When the diamond is used for industrial purposes as a cutting edge of a tool in particular, such impaired properties as described above not only directly impair the product's resistance against polishing, abrasion and the like but also cause problems in the product's production process and hence impair the product's performance indirectly.

More specifically, to form a cutting edge thereof, the diamond is ground. This causes friction and hence heat, which is less relieved as the diamond is impaired in thermal conductance, and the blade's edge is excessively heated and oxidized. This provides the cutting edge at an acting portion with a step of approximately 0.04 mm typically referred to as a sector. As a result, the blade's acting portion as a tool is reduced in sharpness, and the product's ground surface is finished with poor precision.

Furthermore, to provide synthetic diamonds having a further excellent mechanical property, and semiconductance and electrical conductance that diamond inherently does not possess, boron (B) is also introduced into a diamond crystal, as has also been described in Patent Documents 9 and 10. To do so, however, a special type of diamond powder is required as a source of carbon, and the state of the art is still insufficient therefor.

Furthermore, the diamond presenting a yellow color, a dark yellow color in particular, rather than being transparent or presenting colors such as blue and red, has a reduced value as jewelry. Furthermore, it is also difficult to use for optical components, a laser window and the like.

To prevent nitrogen from entering a diamond crystal, a variety of methods have been developed to add aluminum (Al), titanium (Ti), zirconium (Zr) or a similar nitrogen getter in a solvent of metal in manufacturing the diamond. These techniques can provide a diamond having a reduced nitrogen content and also achromatic and transparent. To prevent the diamond crystal from taking thereinto the nitrogen getter's carbide produced in the solvent, however, the crystal must be grown at a reduced rate. This is also done by a variety of techniques, as described in Patent Documents 2-6. Currently, the crystal is grown at a rate of 2 mg/hr to 2.5 mg/hr at maximum. This contributes to increased production cost.

Furthermore, semiconductance and electrical conductance are properties that diamond inherently does not have, and those currently obtained are still insufficient.

Thus there still exists a need for a synthetic single crystal diamond having a small impurity or nitrogen content and inexpensively produced for industrial purposes, for use as tools in particular. Furthermore, there also exists a need for a synthetic single crystal diamond further excellent in abrasion resistance or similar mechanical, physical properties. Similarly, there also exists a need for a synthetic single crystal diamond having semiconductance, an appropriate level of electrical conductance. Furthermore, there also exists a need for a synthetic single crystal diamond having beautiful color and produced inexpensively for jewelry. Furthermore, there also exists a need for tools, jewelry and the like formed of such synthetic single crystal diamond.

Other than the above, there exists a need for a technique developed to help to brazing the diamond to a shank or a similar tool's main body when the diamond is used as a blade of the tool.

Accordingly, one object of the present invention is to provide a diamond tool further excellent in sharpness, abrasion resistance, and stability in quality than conventional diamond tools.

Another object of the present invention is to provide a synthetic single crystal diamond that can have a reduced impurity or nitrogen content and inexpensively be used for industrial purposes, and be excellent in abrasion resistance and similar mechanical, physical properties, have beautiful color, and be readily brazed to a tool's main body, and a method of producing the synthetic single crystal diamond.

Still another object of the present invention is to provide diamond jewelry employing a beautifully colored and inexpensive, synthetic single crystal diamond.

Means for Solving the Problems

The present diamond tool is fabricated with a single crystal diamond artificially synthesized under high pressure in a temperature difference method, and having a crystal containing an impurity in an amount of at most 3 ppm, preferably at most 0.1 ppm.

Artificial, synthetic diamond can have an impurity of nitrogen removed in synthesizing the diamond under high pressure by adding to a solvent a component serving as a nitrogen getter. This, however, disadvantageously, helps the diamond to have an inclusion resulting in a crystal poor in quality. The present inventors have indicated a method that can provide a crystal of good quality despite that the nitrogen getter is added (Non-Patent Document 1). Thus a high purity, synthetic diamond crystal (of the IIa type) having an impurity of nitrogen controlled to be at most 3 ppm can be free of crystal defects, strains and the like attributed to the impurity. This would provide increased hardness and strength and other similar, improved mechanical properties, and also reduced variation in quality. Furthermore, except that there is a slight absorption by the impurity of nitrogen for the ultraviolet range at 270 nm, there is no absorption by the impurity. For a nitrogen content of at most 0.1 ppm, the absorption of 270 nm is neither observed. A transparent crystal can be obtained for a range of ultraviolet to infrared.

The present inventors have examined the high purity, synthetic diamond's mechanical properties more specifically, and found that it has a feature that is not observed in natural diamond nor conventional synthetic diamonds.

Table 1 shows a result of measuring synthetic diamond crystals having different nitrogen contents at a (100) plane in <100> and <110> directions for Knoop hardness. The (100) plane in the <100> direction provides a Knoop hardness improved as the nitrogen content decreases, as shown in FIG. 1. The synthetic diamond crystal having a nitrogen content of at most 1 ppm provides a high hardness of at least 10,000 kg/mm$^2$. The synthetic diamond crystal having a nitrogen content of at most 3 ppm, as measured at the (100) plane in the <110> direction, does not provide a normal Knoop impression, which fact shows a significant hardness. FIG. 2 shows a result of measuring on the (100) plane for each plane orientation for Knoop hardness a synthetic IIa diamond crystal having a nitrogen content of 0.1 ppm, an Ib diamond crystal having a nitrogen content of 60-240 ppm, and a natural, Ia diamond crystal (containing approximately 1,000 ppm of aggregated nitrogen as an impurity).

TABLE 1

| Sample No. | Nitrogen Concentration (ppm) | Knoop Hardness (kg/mm$^2$) (100) <100> | (100) <110> |
|---|---|---|---|
| IIa-01 | 0 | 11779 | * |
| IIa-02 | 0 | 12898 | * |
| IIa-03 | 0.04 | 10554 | * |
| IIa-04 | 0.04 | 11396 | * |
| IIa-05 | 0.04 | 11950 | * |
| IIa-06 | 0.05 | 9867 | * |
| IIa-07 | 0.36 | 10027 | * |
| IIa-08 | 0.5 | 10401 | * |
| IIa-09 | 17 | 8474 | * |
| IIa-10 | 2.6 | 9428 | * |
| Ib-01 | 60 | 8607 | 8475 |
| Ib-02 | 88 | 9669 | 7401 |
| Ib-03 | 235 | 9479 | 8075 |

* Not measurable as no impression is formed.

While natural diamond and typical synthetic diamond on the (100) plane are harder in the <100> direction than <110> direction, the diamond having the impurity content of at most 3 ppm exhibits a tendency opposite thereto. In particular, in the <110> direction, it does not allow a Knoop indenter to provide impression, showing that the diamond is significantly hard. This is probably because the synthetic IIa diamond crystal has a significantly small amount of impurity and defect allowing distortion to start therefrom as the indenter is pressed thereinto. Note that for impurity contents exceeding 3 ppm this tendency is not observed and a tendency similar to that of the natural diamond crystal and the synthetic Ib diamond crystal is shown.

The present diamond tool can be provided as a high-precision cutting tool. The above described, low nitrogen content diamond having high hardness can provide a significantly abrasion resistant, ultra-precision cutting tool.

Furthermore, the present diamond tool can be provided as a microtome knife, a surgical knife or a similar diamond knife. The above described, low nitrogen content diamond having high hardness and reduced defects can provide an excellently sharp diamond knife.

Similarly the present diamond tool can be provided as a line drawing die, a diamond stylus, or the like. The above described, low nitrogen content diamond having high hardness and reduced defects can provide a line drawing die excellent in abrasion resistance and having limited defects.

Furthermore the present diamond tool can be provided as a dresser. The above described, low nitrogen content diamond having high hardness and reduced defects can provide an excellently abrasion resistant, sharp dresser.

As based on the above findings, a synthetic diamond having an impurity content of at most 3 ppm, preferably at most 0.1 ppm, and having reduced crystal defects was used to fabricate a tool. The impurity content can be reduced by using a source of highly pure carbon and a Fe—Co solvent and adding to the solvent a nitrogen getter such as Ti. Furthermore, line defect or dislocation can be removed by employing as a seed a crystal cut out of a diamond crystal of low defect density.

The present synthetic single crystal diamond in one aspect is synthesized under ultra high pressure at high temperature by a temperature difference method, and it is characterized in that it has a crystal containing a nickel introduced by atomic substitution.

The present invention employs a solvent having a large nickel content. Accordingly it provides a pale green, synthetic single crystal diamond. In addition thereto, as the synthetic single crystal diamond has a reduced amount of substitutional atomic nitrogen therein, it can have reduced crystal strains contributing to increased hardness and abrasion resistance.

The reduced nitrogen content allows the diamond to be resistant to degradation attributed to oxidization caused when it is excessively heated as it is processed into a blade of a tool or the like. The blade can thus provide increased sharpness.

Preferably the nickel is contained in an amount of 0.01 to 10 ppm. A nickel content of at most 10 ppm does not adversely affect the synthetic single crystal diamond in hardness, abrasion resistance, and sharpness, and also allows the diamond to present a beautiful pale green color. A nickel content exceeding 10 ppm causes excessive strain, and the present invention's function and effect is hardly exhibited and the diamond also becomes dark in color. A nickel content of less than 0.01 ppm is preferable for synthetic single crystal diamond in strength and other similar mechanical and physical qualities. Such diamond's production is, however, costly and time consuming. This is because using the nickel containing solvent allows a crystal to be grown at a significantly increased rate. Furthermore, to present the pale green color, at least 1 ppm of nickel is preferably contained.

The nitrogen is preferably contained in an amount of 0.01 to 3 ppm. This range allows hardness, abrasion resistance and the like to be increased or the like sufficiently effectively, and also provides reduced production cost.

The present invention that is applied to a synthetic single crystal diamond used for a tool can significantly exhibit an effect such as increased hardness.

If the present synthetic single crystal diamond is used as a blade of a tool, and brazing material is used to braze the diamond to a shank (or the tool's main body), a titanium containing, activated brazing material is preferably used as it can braze the diamond at a relatively low temperature.

The present synthetic single crystal diamond, having an extremely small nitrogen content and containing nickel, does not present a dark yellow color but a pale green color. As such, it is preferable that the present diamond be used as jewelry.

When the present synthetic single crystal diamond is used for a tool, the tool can be a significantly hard and abrasion resistant tool and thus effectively provide increased life and the like. Such tool can include a cutting tool, a dresser and the like. Furthermore, when the present synthetic single crystal diamond is used for jewelry, it can provide pale green, brilliant jewelry and thus obtain high evaluation.

The present method of synthesizing a single crystal diamond synthesizes a single crystal diamond under ultra high pressure at high temperature by a temperature difference method, and it is characterized by employing a solvent containing at least one of iron and cobalt, at least 36% by weight of nickel, 1-2% by weight of titanium, and 3-5.5% by weight of graphite.

In the present invention the solvent contains approximately 1-2% by weight, preferably approximately 1.5% by weight of titanium, which reacts with nitrogen contained as an impurity and thus prevents the nitrogen from disadvantageously entering the diamond crystal. Furthermore, despite that copper or a similar element that prevents inclusion is not added, the titanium will not be introduced into the diamond crystal as an inclusion. This is presumably because the solvent contains approximately 36% by weight, preferably approximately 40% by weight of nickel, which has in the periodic table a position significantly close to copper. The nickel is introduced into the diamond crystal as a substitutional atomic impurity in an amount of at most 10 ppm.

The seed crystal's seed face is preferably a (100) plane as it allows the crystal to be grown preferably. Furthermore, the synthetic single crystal diamond is synthesized preferably at 1380±25° C., since such temperature can help the nickel as a substitutional atomic impurity to be introduced into the diamond crystal, as appropriate.

The synthetic single crystal diamond is synthesized preferably at a rate of 3.9-4.7 mg/hr (hour), since such rate can contribute to increased cost effectiveness and also help the nickel as a substitutional atomic impurity to be introduced into the diamond crystal, as appropriate.

The present synthetic single crystal diamond in another aspect is synthesized under ultra high pressure at high temperature by a temperature difference method and has a crystal containing boron and nickel introduced by atomic substitution.

The present invention allows a solvent to contain nickel in an increased amount and also adds titanium or a similar nitrogen getter and boron. This allows the synthetic single crystal diamond to contain reduced substitutional atomic nitrogen and instead contain substitutional atomic boron and nickel.

Mainly there can be obtained a synthetic single crystal diamond that has reduced crystal strains for a reduced nitrogen content and has significant hardness and significant abrasion resistance for boron contained therein. The reduced nitrogen content allows the diamond to be resistant to degradation attributed to oxidization caused when it is excessively heated as it is processed into a blade of a tool or the like. The blade can thus provide increased sharpness. Furthermore, the synthetic single crystal diamond that contains boron will also be electrically conductive. Furthermore, the synthetic single crystal diamond that contains boron and nickel presents a pale blue-green color.

Preferably the boron is contained in an amount of 1-300 ppm. 300 ppm or less of boron allows the solvent to have metal taken into the diamond crystal as an impurity in a limited amount contributing to excellent abrasion resistance. More than 300 ppm of boron provides a brittle crystal also dark in color and thus unsuitable for practical use. One ppm or larger, higher than 5 ppm, in particular, of boron allows the diamond to present an appropriate pale blue-green color and also have an appropriate level of electrical conductance.

The nickel is preferably contained in an amount of 0.01-10 ppm. The nickel contained in an amount of 10 ppm or less allows the diamond to present a pale blue-green color and together with an action of titanium or a similar nitrogen getter acts to relatively reduce nitrogen introduced into the diamond crystal by atomic substitution and thus provides a single crystal diamond satisfactory in hardness, abrasion resistance, and sharpness. The nickel contained in an amount exceeding 10 ppm causes excessive strains and also provides a dark color. The nickel contained in an amount less than 0.01 ppm consumes time and cost for producing the diamond. Furthermore, the nickel is preferably contained in an amount of at least 1 ppm as it can cooperate with the coexisting boron to present a pale blue-green color.

Preferably the nitrogen is contained in an amount of 3 ppm or less. Such amount allows the diamond crystal to have reduced strains allowing satisfactory hardness, abrasion resistance, and sharpness.

The present invention that is applied to a synthetic single crystal diamond used for a tool can exhibit excellent abrasion resistance or a similar effect significantly.

If the present synthetic single crystal diamond is used for a blade of a tool, and wax is used to braze the diamond to a shank (or the tool's main body), a titanium containing, activated wax is preferably used as it can braze the diamond at a relatively low temperature.

As the present synthetic single crystal diamond substantially excludes nitrogen and contains boron and nickel, it presents a pale blue-green color. As such, it is preferably used as jewelry.

When the present synthetic single crystal diamond is used for a tool, the tool can be a significantly hard and abrasion resistant tool and thus effectively provide increased life and the like. Such tool can include a cutting tool, a dresser and-the like. Furthermore, when the present synthetic single crystal diamond is used for jewelry, it can provide pale blue-green, brilliant jewelry and thus obtain high evaluation.

The present method of synthesizing a single crystal diamond, in another aspect, synthesizes a single crystal diamond under ultra high pressure at high temperature by a temperature difference method, and it is characterized by employing a solvent containing at least one of iron and cobalt, at least 36% by weight of nickel, 1-2% by weight of titanium, 0.1-0.2% by weight of boron, and 3-5.5% by weight of graphite.

In the present invention the solvent contains approximately 1-2% by weight, preferably approximately 1.5 (±10) % by weight of a nitrogen getter (titanium in an example), which reacts with nitrogen contained as an impurity and thus prevents the nitrogen from disadvantageously entering the diamond crystal. Furthermore, despite that copper or a similar element that prevents inclusion is not added, the titanium or a similar nitrogen getter will not be introduced into the diamond crystal as an inclusion. This is presumably because the solvent contains approximately 36% by weight, preferably approximately 40% by weight of nickel, which has in the periodic table a position significantly close to copper. The nickel is introduced into the diamond crystal as a substitutional atomic impurity in an amount of at most 10 ppm. Furthermore the boron that is contained in the solvent in an amount of approximately 0.1-0.2% by weight, preferably approximately 0.15% by weight is also introduced into the diamond crystal as a substitutional atomic impurity in an amount of at most 300 ppm.

Furthermore the seed crystal's seed face is preferably a (100) plane of the diamond crystal as it allows the boron to be uniformly distributed and the diamond crystal to be grown preferably.

Furthermore, the synthetic single crystal diamond is synthesized preferably at 1350±30° C., since such temperature allows a substitutional atomic impurity, i.e., nickel and boron to be introduced into the diamond crystal, as appropriate.

Furthermore, the synthetic single crystal diamond is synthesized preferably at a rate of 3.1-3.8 mg/hr (hour), since such rate can contribute to increased cost effectiveness and also allows a substitutional atomic impurity, i.e., nickel and boron to be introduced into the diamond crystal, as appropriate.

The present diamond jewelry is produced from the above described synthetic single crystal diamond.

Effects of the Invention

When single crystal diamond is used to fabricate a tool, employing a synthetic diamond having a small amount of nitrogen as an impurity allows the tool to be a diamond tool having high hardness and reduced defects and thus further superior in sharpness, abrasion resistance and stability in quality to conventional diamond tools.

The present synthetic single crystal diamond can have limited substitutional atomic nitrogen therein. This can contribute to reduced crystal strain and increased hardness and abrasion resistance to allow a preferable tool to be fabricated. Furthermore, a solvent that contains nickel allows the diamond to be synthesized at an increased growth rate and thus produced at reduced cost. Furthermore, as the present synthetic single crystal diamond can present a pale green color, it can provide significantly valuable jewelry.

Furthermore, the present synthetic single crystal diamond has a small content of nitrogen contained in a crystal as a substitutional atomic impurity and contains an appropriate amount of boron. As such, the present diamond can have excellent abrasion resistance. Furthermore, the present diamond can also provide a synthetic single crystal diamond excellent for example in abrasion resistance and thus useful as a blade of a tool. Furthermore, the present diamond can provide an adequately electrically conductive, synthetic single crystal diamond. Furthermore, the present synthetic single crystal diamond can contain nickel and boron in a crystal as a substitutional atomic impurity, and thus present a pale blue-green color having a high value as jewelry. Furthermore, the above described synthetic single crystal diamond can be obtained inexpensively.

DESCRIPTION OF THE REFERENCE SIGNS

Figure 1:
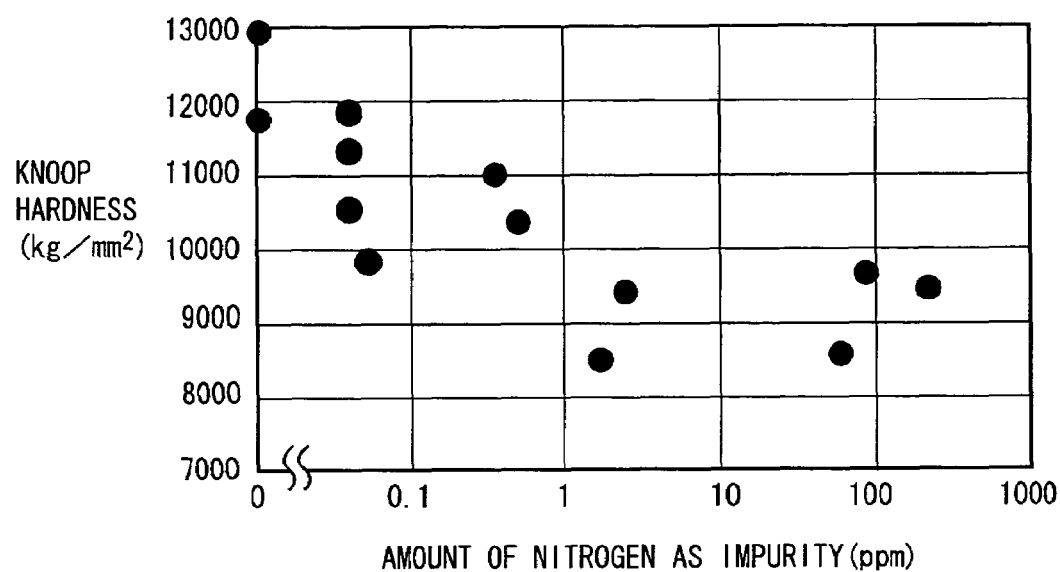
FIG. 1 represents a synthetic diamond at a (100) plane in a <100> direction in Knoop hardness.
Figure 2:
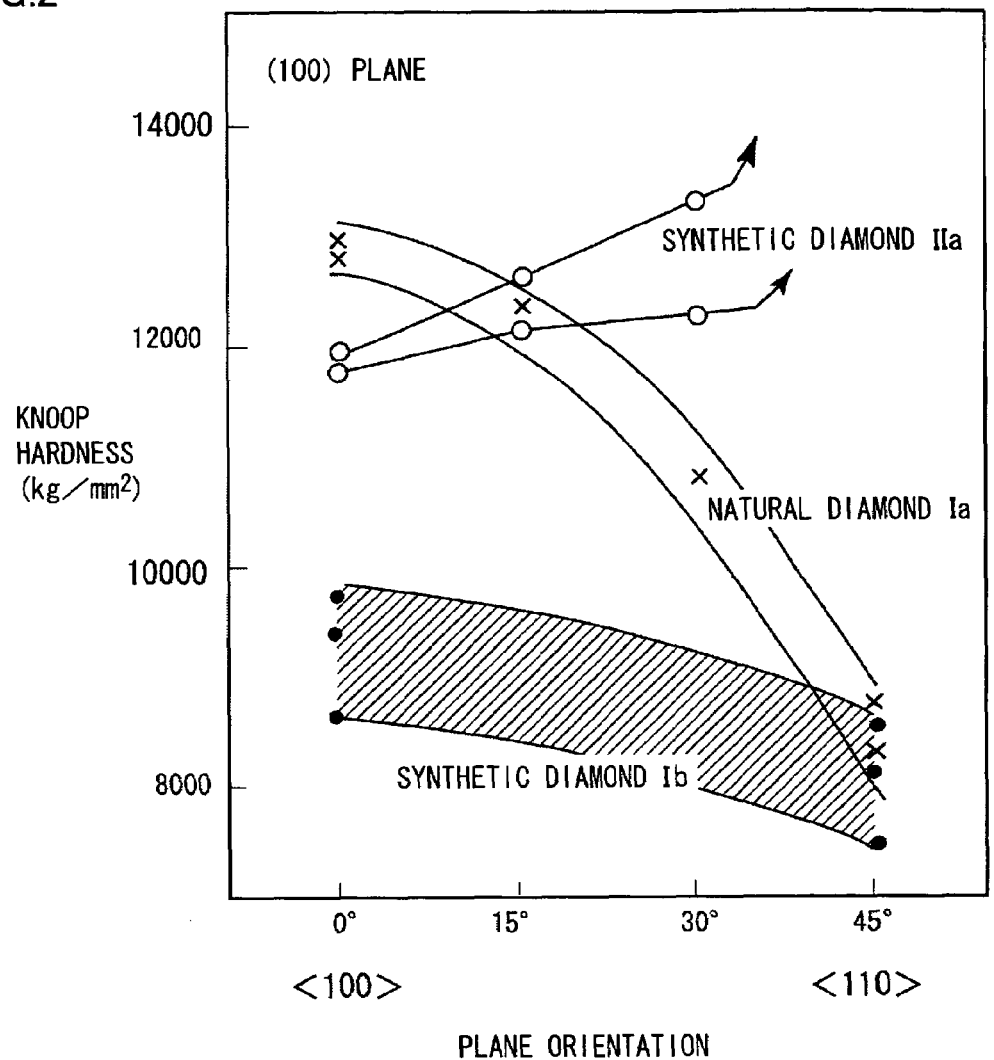
FIG. 2 represents a variety of types of diamond at the (100) plane for each plane orientation in Knoop hardness.

11: source of carbon, 12: solvent of metal, 13: seed crystal, 14: insulator, 15: graphite heater, 16: pressure medium, 21: blade of synthetic single crystal diamond, 22: brazing layer, 23: end of shank, 31: dresser of synthetic single crystal diamond, 32: sintered portion

BEST MODES FOR CARRYING OUT THE INVENTION

Hereinafter the present invention in examples will be described.

FIRST EXAMPLE

Under high pressure a temperature difference method was employed to synthesize a diamond crystal. More specifically, as a source material, highly pure graphite was used, and as a solvent, a Fe—Co solvent was used, with 1.5% by weight of Ti added thereto as a nitrogen getter. As a seed crystal, a crystal of low defect density was used with a (001) plane serving as a seed face, and a pressure of 5.5 GPa was applied at a temperature of 1350° C. for 70 hours to synthesize approximately 0.8 carat of a single crystal of high purity, IIa diamond.

The obtained diamond crystal was achromatic and transparent and substantially not observed to absorb both ultraviolet, visible and infrared spectra by nitrogen or similar impurity, and was a high purity IIa crystal having 0.1 ppm or less of impurity. Furthermore, as observed with a polarizing microscope, the diamond crystal substantially did not have internal strains, and as observed by x ray topography, the diamond crystal substantially did not have crystal defects.

The diamond crystal obtained as described above was used to fabricate a cutting tool, as follows: the diamond crystal was processed to have a length of 3 mm, a width of 1 mm and a thickness of 1 mm and brazed to the cutting tool's shank preferably by employing a Ti containing, activated wax as it allows the diamond crystal to be brazed at a relatively low temperature and thus allows the single crystal diamond to have a surface less thermally impaired. Furthermore, the diamond material is brazed to the shank with a layer of the wax preferably having a thickness of 100 μm or larger. This allows the obtained cutting tool to have an end with reduced residual stress caused in brazing the crystal to the shank. Furthermore, to ensure a surface for brazing the single crystal diamond material, a (100) plane was set as upper and lower faces. Subsequently, a cutting tool having a diamond blade with an edge having an R of 10 μm and an angle of 45° was fabricated.

If in doing so the edge's plane orientation is a (110) plane it helps to polish the material and thus allows the tool to have an edge increased in strength and sharpness. Furthermore, in fabricating the cutting tool, a skaif having free abrasive grains of diamond on an iron casting mill and rotating at a high rate, was used. The cutting tool thus produced had a blade with an edge observed to be completely free of small fractures of several microns or smaller in size. This cutting tool was set on a precision lathe rotating a workpiece at 800 rpm while the tool was fed at 0.3 μm/r to provide a cut of 1 μm in a metal Ni portion plating a surface of a molding die. There was not observed a trace caused as the tool was fed, and a mirror finished surface was obtained with high precision.

SECOND EXAMPLE

Except that the nitrogen getter or Ti was added in an amount of 1.5% by weight, a manner similar to that described in the first example was employed to synthesized an approximately 0.8 carat of a single crystal of high-purity, IIa diamond. The obtained diamond crystal was slightly yellow and more or less absorbed ultraviolet visible spectrum by isolated substitutional impurity of nitrogen contained in an amount of approximately 2.8 ppm. As observed with a polarizing microscope, it was confirmed that the diamond crystal substantially did not have internal strains, and as observed by x ray topography, that it substantially did not have crystal defects.

The diamond crystal thus obtained was used to fabricate a cutting tool similarly as described in the first example. The cutting tool had a blade with an edge observed to be completely free of small fractures of several microns or smaller in size. This cutting tool was set on a precision lathe and conditions similar to those for the first examples were adopted to cut a metal Ni portion plating a surface of a molding die. There was not observed a trace caused as the tool was fed, and a mirror finished surface was obtained with high precision.

FIRST COMPARATIVE EXAMPLE

Except that the nitrogen getter was not used, a manner similar to that of the first example was employed to synthesize a diamond. The obtained diamond is one carat of an Ib crystal containing nitrogen as an impurity and presenting a yellow color. As estimated by infrared absorption spectrum, the nitrogen had an amount of approximately 60 ppm. The synthetic, Ib diamond crystal was employed to fabricate an ultra high precision cutting tool similarly as has been described in the first example. The obtained cutting tool was inferior to that of the first example in sharpness and abrasion resistance.

SECOND COMPARATIVE EXAMPLE

Natural, Ia diamond was employed to fabricate a cutting tool similarly as has been described in the first example. Presumably because the cutting tool had a blade with a defect, it was not sharp and also provided significant abrasion in cutting a workpiece.

THIRD EXAMPLE

The present invention in a third example will be described hereinafter.

Synthesis

Initially will be described how the diamond is synthesized.

Figure 3:
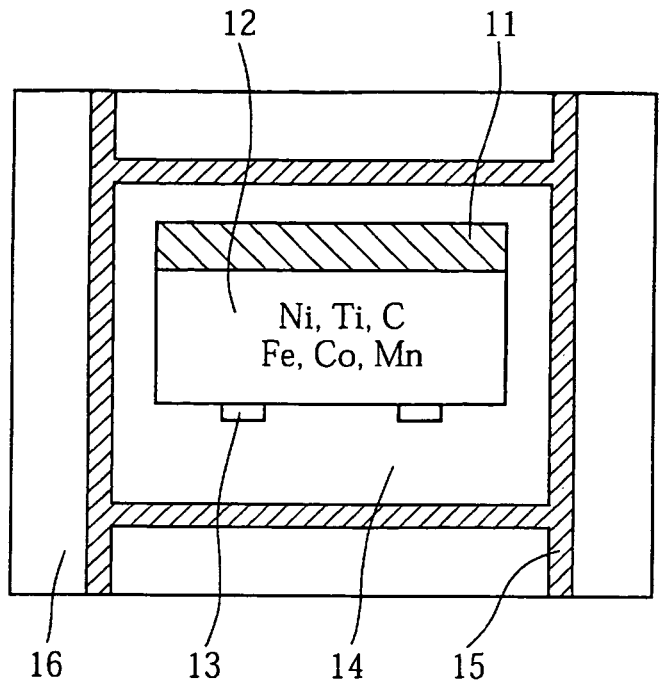
FIG. 3 shows a concept of an apparatus synthesizing a synthetic single crystal diamond in a third example of the present invention.

FIG. 3 shows an apparatus synthesizing a diamond in the present example. In the figure, reference numerals 11, 12, 13, 14, 15 and 16 denote a source of carbon, a solvent of metal, a seed crystal, an insulator, a graphite heater, and a pressure medium, respectively.

The source of carbon 11 was graphite. The solvent of metal 12 contained 42% by weight of nickel as an essential component, and 1.5% by weight of titanium as a nitrogen getter.

The remainder was 53% by weight of iron, 5% by weight of cobalt and 4.5% by weight of graphite, all in the form of high purity powder having a grain size of 50-100 microns. Note that the iron and the cobalt were blended at a ratio having a considerable degree of freedom. Furthermore for the seed crystal a (100) plane of abrasive grains of synthetic diamond served as a seed face.

A pressure of 5.5 GPa was applied at 1380° C., with the source of carbon and the seed crystal having a difference in temperature of 30° C., for 70 hours to synthesize 10 pieces of 1.5-carat, single crystal diamond. Note that one carat corresponds to 200 mg. The obtained single crystal diamond had a large (100) plane, and it was measured for absorption of ultraviolet visible and infrared spectra, and it was confirmed that it contained 3 ppm or less of nitrogen and 10 ppm or less of nickel. It should be noted, however, that as the diamond had a pale green color, it was estimated to contain nickel in an amount of at least 1 ppm, which corresponds to a concentration allowing the diamond to start to have the pale green color. The diamond was estimated to contain at least 1.5-2 ppm of nickel.

Furthermore, as observed with a polarizing microscope, the diamond substantial did not have internal strains. Furthermore, as observed by x ray topography, the diamond substantial did not have crystal defects.

Production of Blade of Tool

The present example's synthetic diamond was used for a blade of a tool, as described hereinafter.

The above described synthetic diamond was processed to produce a material of synthetic single crystal diamond having a length of 5 mm, a width of 1 mm and a thickness of 1 mm for a blade. The material was brazed to a shank with a titanium containing, activated wax as it allows the material to be brazed at a relatively low temperature and hence the single crystal diamond to have a surface less thermally impaired.

Furthermore, to prevent the cutting tool from having an end with thermal stress remaining therein, the wax was provided in a layer having a thickness of 100 μm or larger. Furthermore to ensure a surface for brazing the material to the shank a (100) plane was set as the material's upper and lower surfaces.

Subsequently, a rapidly rotating polisher was employed to form a blade for a cutting tool having an edge with an R of 100 μm an angle of 30° and a rake of 20°. It was confirmed that the edge did not have a fracture of 1 μm or larger and was thus sharp.

Figure 4A:
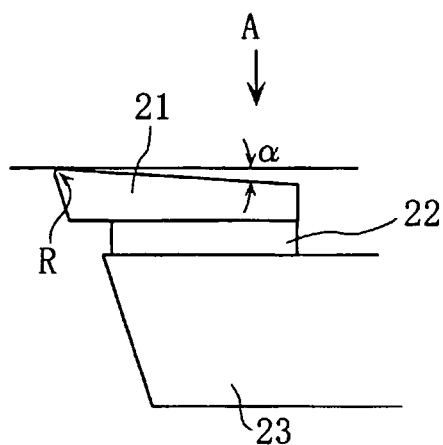
FIG. 4A is a side view of a blade of a tool employing the synthetic single crystal diamond in the third example of the present invention.
Figure 4B:
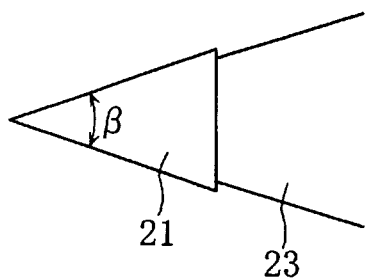
FIG. 4B is a plan view of the blade of the tool shown in FIG. 4A.

The blade is shown in FIGS. 4A and 4B. In the figures, a reference numeral 21 denotes the blade's synthetic single crystal diamond. R represents the edge's diameter. α indicates a rake, which is 20°, and β indicates the edge's angle, which is 30°. A reference numeral 22 denotes a titanium containing, brazing layer. A reference numeral 23 denotes an end of the shank.

This cutting tool was attached to a high precision lathe. A portion to be cut had a diameter of 5 mm and was rotated at 3,000 rpm while the tool was fed at 0.3 μm/r to provide a cut of 0.1 μm in the nickel plating a surface of a molding die of metal to obtain a mirror finished surface with high precision.

When conventional synthetic single crystal diamond was used to fabricate a tool and such tools were used under a cutting condition, 58 tools endured, whereas when the present invention was used to fabricate a tool and such tools were used under the same cutting condition, 93 tools endured. As a result it was confirmed that the present example provided a synthetic single crystal diamond suitable for a material for a blade of a tool.

Fabrication of Dresser

The present example's synthetic single crystal diamond is employed for a dresser, as described hereinafter.

A rough diamond synthesized by the above described apparatus in the above described method was cleaved along a (111) plane to have a thickness of 0.8 mm and cut by a laser to provide a material in the form of a strip having a length of 3 mm, a width of 0.8 mm and a thickness of 0.8 mm. Three such strips were arranged in sintering powder containing nickel as a main component, and sintered.

Note that the strip was provided to have a long surface portion corresponding to a cleavage plane (111) and a laser cut plane (110), and a dressing surface corresponding to a (211) plane. Accordingly, an end surface of a test piece formed of the strip will be the dressing surface and accordingly parallel to a polishing direction <110>.

Figure 5:
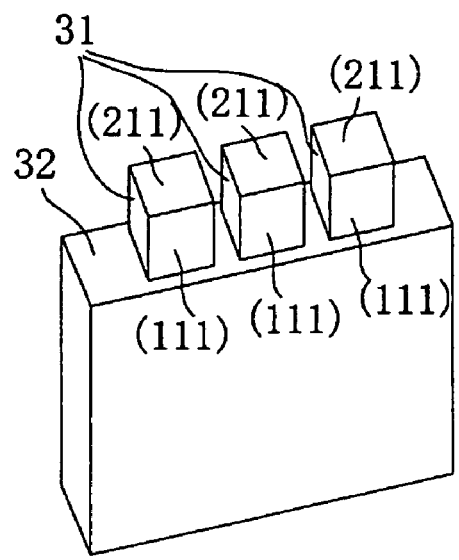
FIG. 5 is a perspective view of a dresser employing the synthetic single crystal diamond in the third example of the present invention.

This dresser is shown in FIG. 5. In the figure, a reference numeral 31 denotes the material of synthetic single crystal diamond in a strip and a reference numeral 32 indicates a sintered portion thereof.

The dresser was reciprocated, with a grindstone SN80N8V51S (available from Noritake, 405×50×127 mm) having a circumferential rate of 1,500 rpm to provide a cut in an amount of 0.1 mm for each pass while it was fed by 0.5 mm/rev under a condition for a method employing a liquid (a grinding oil: Noritake cool NK88), for 20 minutes in a direction parallel to the grindstone's axis of rotation to dress a workpiece, while an amount of abrasion was measured.

Furthermore under the same condition a dresser employing conventional synthetic single crystal diamond was also measured for abrasion in amount. The result is as shown in Table 2, revealing that the present example provides a synthetic single crystal diamond providing a significantly smaller amount of abrasion than conventional synthetic single crystal diamond and thus suitable for a material for a dresser.

TABLE 2

| | Plane Orientation | Dressing Direction | Amount of Abrasion ($10^{-3}$ mm$^3$) |
| --- | --- | --- | --- |
| Conventional Product | (211) | <110> | 13.5 |
| Present Invention | (211) | <110> | 9.8 |

Use for Jewelry

Finally will be described the present example's synthetic single crystal diamond used for jewelry.

1.55 carat of diamond synthesized in the above described apparatus by the above described method was processed with a skaif to have a round, brilliant cut.

The obtained, 0.45 carat of the diamond for jewelry was completely free of chipping and cracking, and was a slightly green, brilliant diamond.

FOURTH EXAMPLE

Hereinafter the present invention in a fourth example will be described.

Synthesis

Initially the present example provides a diamond synthesized as described hereinafter.

Figure 6:
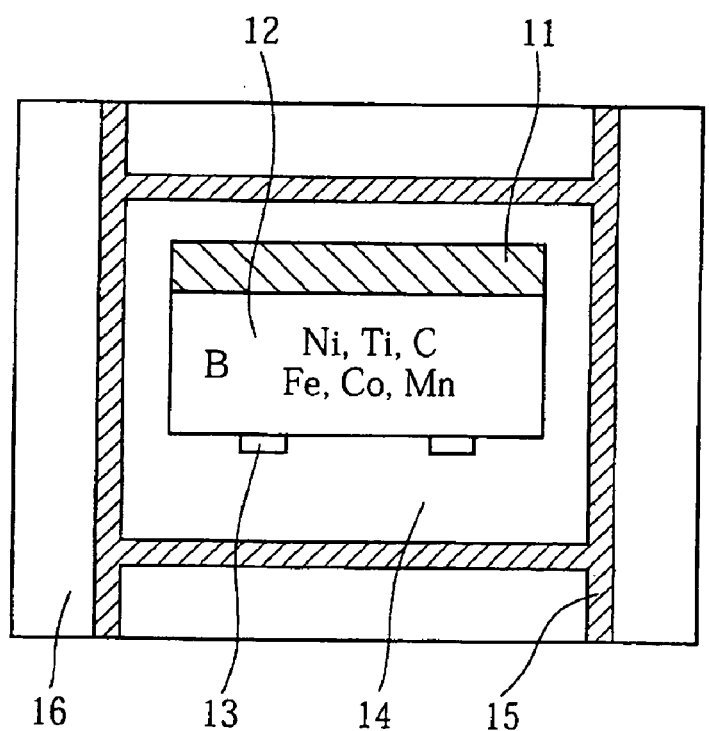
FIG. 6 shows a concept of an apparatus synthesizing a synthetic single crystal diamond in a fourth example of the present invention.

FIG. 6 shows an apparatus synthesizing a diamond in the present example. In the figure, reference numerals 11, 12, 13, 14, 15 and 16 denote a source of carbon, a solvent of metal, a seed crystal, an insulator, a graphite heater, and a pressure medium, respectively.

The source of carbon 11 was graphite. The solvent of metal 12 contained 42% by weight of nickel and 0.15% by weight of boron as essential components and 1.5% by weight of titanium as a nitrogen getter. The remaining was 46.85% by weight of iron, 5% by weight of cobalt and 4.5% by weight of graphite, all in the form of high purity powder having a grain size of 50-100 microns. Note that the iron and the cobalt were blended at a ratio having a considerable degree of freedom. Furthermore for the seed crystal a (100) plane of abrasive grains of synthetic diamond served as a seed face.

A pressure of 5.5 GPa was applied at 1350° C., with the source of carbon and the seed crystal having a difference in temperature of 30° C., for 70 hours to synthesize 10 pieces of 1.2-carat, single crystal diamond.

The obtained single crystal diamond had a large (100) plane, and it was measured for absorption of ultraviolet visible and infrared spectra, and it was confirmed that it contained 3 ppm or less of nitrogen, 50 ppm of boron and 10 ppm or less of nickel. The diamond was estimated to contain nickel at least by 1 ppm, since the diamond crystal had a pale blue green color, a mixture of a blue color attributed to boron and a green color attributed to nickel.

Furthermore, as observed with a polarizing microscope, the diamond substantially did not have internal strains. Furthermore, as observed by x ray topography, the diamond substantially did not have crystal defects. Furthermore, a single crystal of the diamond was also measured for electrical resistance. It had a resistance of 10-100 Ω·cm, revealing that it had adequate electrical conductance.

Production of Blade of Tool

The present example's synthetic diamond was used for a blade of a tool, as described hereinafter.

The above described synthetic single crystal diamond was processed to produce a material of synthetic single crystal diamond having a length of 5 mm, a width of 1 mm and a thickness of 1 mm for a blade of a diamond end mill. The material was brazed to a shank with a titanium containing, activated wax as it allows the material to be brazed at a relatively low temperature and hence the single crystal diamond to have a surface less thermally impaired.

Furthermore to prevent the cutting tool of diamond from having an end with thermal stress remaining therein, the wax was provided in a layer having a thickness of 100 μm or larger. Furthermore to ensure a surface for brazing the material to the shank a (100) plane was set as the material's upper and lower surfaces.

Subsequently, a rapidly rotating polisher was employed to form a blade for a cutting tool having an edge with an R of 100 μm, an angle of 30° and a rake of 20°. It was confirmed that the edge did not have a fracture of 1 μm or larger and was thus sharp.

Figure 7A:
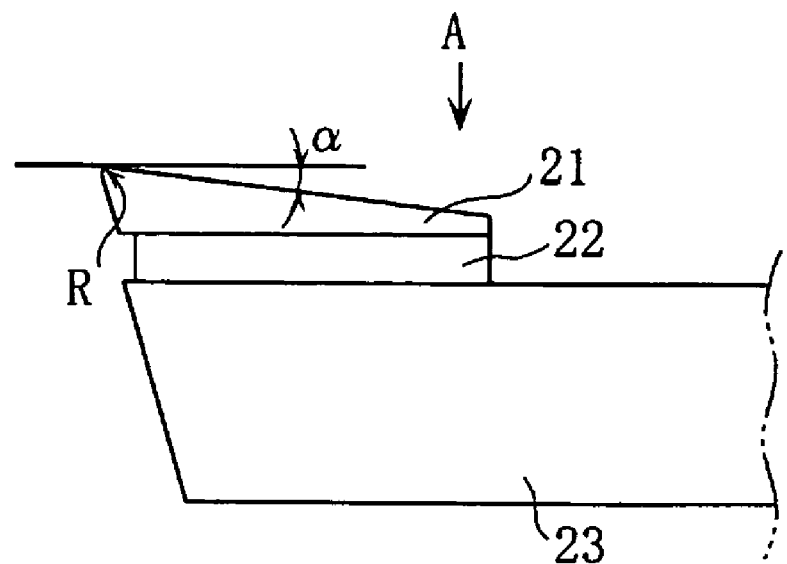
FIG. 7A is a side view of a blade of a tool employing the synthetic single crystal diamond in the fourth example of the present invention.
Figure 7B:
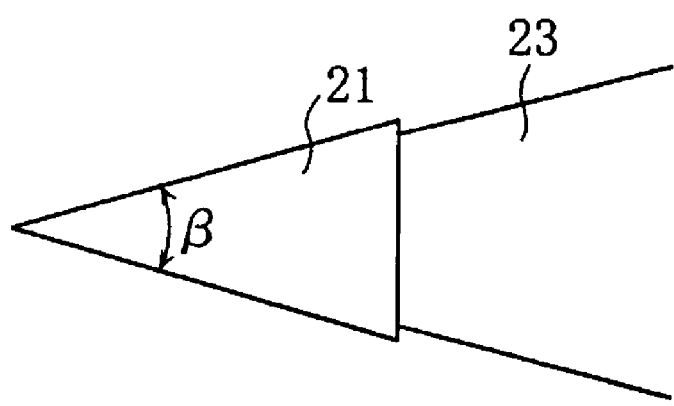
FIG. 7B is a plan view of the blade of the tool shown in FIG. 7A.

The blade is shown in FIGS. 7A and 7B. In the figures, a reference numeral 21 denotes the blade's synthetic single crystal diamond. R represents the edge's diameter. α indicates a rake, which is 20°, and β indicates the edge's angle, which is 30°. A reference numeral 22 denotes a titanium containing, brazing layer. A reference numeral 23 denotes an end of the shank.

This cutting tool was attached to a high precision lathe. A portion to be cut had a diameter of 5 mm and was rotated at 3,000 rpm while the tool was fed at 0.3 μm/r to provide a cut of 0.1 μm in the nickel plating a surface of a molding die of metal to obtain a mirror finished surface with high precision.

When conventional synthetic single crystal diamond was used to fabricate a tool and such tools were used under a cutting condition, 58 tools endured, whereas when the present invention was used to fabricate a tool and such tools were used under the same cutting condition, 85 tools endured. As a result it was confirmed that the present example provided a synthetic single crystal diamond suitable for a material for a blade of a tool.

The present example provides a synthetic single crystal diamond having adequate electrical conductance. As such, if it is attached to equipment capable of automatically exchanging a tool, the tool can be measured for electrical resistance to determine whether it contacts an object to be cut or the like. The tool's management and production quality management can also be facilitated.

Use for Jewelry

Finally will be described the present example's synthetic single crystal diamond used for jewelry.

1.2 carat of synthetic single crystal diamond synthesized in the above described apparatus by the above described method was processed with a skaif to have a round, brilliant cut.

The obtained, 0.36 carat of the diamond for jewelry was completely free of chipping and cracking, and was a slightly green, brilliant diamond.

Each embodiment of the present invention described above may be combined together as appropriate. Furthermore, although the present invention has been described and illustrated in detail, it is clearly understood that the same is by way of illustration and example only and is not to be taken by way of limitation, the spirit and scope of the present invention being limited only by the terms of the appended claims.

INDUSTRIAL APPLICABILITY

The present invention is effectively applicable to diamond tools, synthetic single crystal diamonds, methods of synthesizing single crystal diamonds, and diamond jewelry.

The invention claimed is:

1. A diamond tool fabricated with a single crystal diamond artificially synthesized under high pressure in a temperature difference method, characterized in that said diamond has a crystal containing nitrogen in an amount of at most 3 ppm, and said diamond has a Knoop hardness on a (100) plane being higher in a <110> direction than in a <100> direction, and the tool has a blade with an end having a plane orientation being a (110) plane.

2. The diamond tool according to claim 1, wherein said crystal contains said nitrogen in an amount of at most 0.1 ppm.

3. The diamond tool according to claim 1, being one of an ultra high precision cutting tool, a microtome knife, a diamond knife, a diamond stylus, a line drawing die, and a dresser.

4. The diamond tool according to claim 1, wherein a titanium containing, activated brazing material is employed to attach said diamond to a main body of the tool.

5. The diamond tool according to claim 1, wherein said amount of said nitrogen is less than 3 ppm.

6. The diamond tool according to claim 1, wherein said amount of said nitrogen is less than 1 ppm.

7. The diamond tool according to claim 1, wherein said amount of said nitrogen is less than 0.5 ppm.

8. The diamond tool according to claim 7, wherein said amount of said nitrogen is at least 0.04 ppm.

9. A diamond tool fabricated with a single crystal diamond artificially synthesized under high pressure in a temperature difference method, characterized in that said diamond has a crystal containing nitrogen in an amount of at most 3 ppm, and said diamond has a Knoop hardness on a (100) plane being higher in a <110> direction than in a <100> direction, and the tool has a blade with an end having a plane orientation being a (110) plane, and said crystal also contains nickel in an amount of at least 0.01 ppm and not more than 10 ppm.

10. The diamond tool according to claim 9, wherein a titanium containing, activated brazing material is employed to attach said diamond to a main body of the tool.

11. The diamond tool according to claim 9, wherein said amount of said nickel is less than 10 ppm.

12. The diamond tool according to claim 9, wherein said amount of said nickel is less than or equal to 2 ppm.

13. A diamond tool fabricated with a single crystal diamond artificially synthesized under high pressure in a temperature difference method, characterized in that said diamond has a crystal containing nitrogen in an amount of at most 3 ppm, and said diamond has a Knoop hardness on a (100) plane being higher in a <110> direction than in a <100> direction, and the tool has a blade with an end having a plane orientation being a (110) plane, and said crystal also contains boron in an amount of at least 0.01 ppm and not more then 300 ppm and nickel in an amount of at least 0.01 ppm and not more than 10 ppm.

14. The diamond tool according to claim 13, wherein a titanium containing, activated brazing material is employed to attach said diamond to a main body of the tool.

15. A diamond jewelry article comprising a synthetic single crystal diamond artificially synthesized under high pressure in a temperature difference method, characterized in that said diamond has a crystal containing nickel as a substitutional atom and containing nitrogen in an amount of not more than 3 ppm, and said diamond has a Knoop hardness on a (100) plane being higher in a <110> direction than in a <100> direction.

16. The diamond jewelry article according to claim 15, wherein said nickel is contained in an amount of at least 0.01 ppm and not more than 10 ppm.

17. The diamond jewelry article according to claim 15, containing said nitrogen in an amount of at least 0.01 ppm and not more than 3 ppm.

18. The diamond jewelry article according to claim 15, wherein said crystal further contains boron as a substitutional atom.

19. The diamond jewelry article according to claim 18, wherein said boron is contained in an amount of at least 0.01 ppm and not more than 300 ppm.

20. A method of synthesizing a single crystal diamond under ultra high pressure at high temperature in a temperature difference method, characterized by employing a solvent formed of at least one of iron and cobalt, at least 36% by weight of nickel, at least 1% by weight and at most 2% by weight of titanium, and at least 3% by weight and at most 5.5% by weight of graphite.

21. The method according to claim 20, wherein a seed face of a seed crystal is a (100) plane of a crystal of diamond.

22. The method according to claim 20, wherein said single crystal diamond is synthesized at 1380±25° C.

23. The method according to claim 20, wherein said single crystal diamond is synthesized at a rate of at least 3.9 mg/hr and at most 4.7 mg/hr.

24. A method of synthesizing a single crystal diamond under ultra high pressure at high temperature in a temperature difference method, characterized by employing a solvent formed of at least one of iron and cobalt, at least 36% by weight of nickel, at least 1% by weight and at most 2% by weight of titanium, at least 0.1% by weight and at most 0.2% by weight of boron and at least 3% by weight and at most 5.5% by weight of graphite.

25. The method according to claim 24, wherein a seed face of a seed crystal is a (100) plane of a crystal of diamond.

26. The method according to claim 24, wherein said single crystal diamond is synthesized at 1350±30° C.

27. The method according to claim 24, wherein said single crystal diamond is synthesized at a rate of at least 3.1 mg/hr and at most 3.8 mg/hr.

* * * * *

UNITED STATES PATENT AND TRADEMARK OFFICE
CERTIFICATE OF CORRECTION

| | |
|---|---|
| PATENT NO. | : 7,404,399 B2 |
| APPLICATION NO. | : 10/572708 |
| DATED | : July 29, 2008 |
| INVENTOR(S) | : Sumiya et al. |

It is certified that error appears in the above-identified patent and that said Letters Patent is hereby corrected as shown below:

<u>Title page</u>,
Item [56], References Cited, following Line 1, insert
--4,617,181 A * 10/1986 Yazu et al.--
--5,078,551 A * 01/1992 Oomen--

<u>Title page, Page 2</u>,
Item [56], References Cited, Column 1, following Line 1, insert
--6,030,595 A * 02/2000 Sumiya et al.--
--6,129,900 A * 10/2000 Satoh et al.--

FOREIGN PATENT DOCUMENTS
following Line 1, insert
--JP 60-012747 01/1985--
--JP 02-198704 08/1990--
--JP 03-131407 06/1991--
--JP 03-217226 09/1991--
--JP 03-228504 10/1991--
--JP 05-058786 03/1993--

<u>Column 4, Table 1</u>,
Line 54, after "IIa-09", replace "17" with --1.7--

<u>Column 7</u>,
Line 49, after "dresser", replace "and-the" with --and the--

Signed and Sealed this

Twenty-first Day of July, 2009

JOHN DOLL
*Acting Director of the United States Patent and Trademark Office*